United States Patent [19]
Snow

[11] Patent Number: 5,184,128
[45] Date of Patent: Feb. 2, 1993

[54] INTEGRATING A/D CONVERTER WITH MEANS FOR REDUCING ROLLOVER ERROR

[75] Inventor: Dane R. Snow, Santa Clara, Calif.

[73] Assignee: Harris Corporation, Melbourne, Fla.

[21] Appl. No.: 740,700

[22] Filed: Aug. 6, 1991

[51] Int. Cl.[5] .............................................. H03M 1/82
[52] U.S. Cl. .................... 341/128; 341/167; 341/118
[58] Field of Search ............... 341/128, 129, 167, 168, 341/118

[56] References Cited

U.S. PATENT DOCUMENTS

| | | | |
|---|---|---|---|
| 3,500,384 | 3/1970 | Naydan et al. | 341/128 |
| 3,737,893 | 6/1973 | Belet et al. | 341/118 |
| 4,074,257 | 2/1978 | Henry | 341/120 |
| 4,082,998 | 4/1978 | Marriott | 341/128 X |
| 4,568,913 | 2/1986 | Evans | 341/118 |
| 4,656,459 | 4/1987 | Thurber, Jr. | 341/118 |
| 4,857,933 | 8/1989 | Knight | 341/168 |

Primary Examiner—Marc Hoff
Attorney, Agent, or Firm—Joel I. Rosenblatt

[57] ABSTRACT

An improved integrating type A/D converter has a set of analog switches and a control logic unit for selectively connecting a pair of input terminals for an unknown analog input voltage signal with a pair of input leads across a buffer and integrator in order to apply, first in an integrate phase, the analog input signal in a polarity direction that causes the integrator to ramp up in the same direction regardless of the polarity of the analog input signal, and then in a deintegrate phase, reference voltages are applied across the input leads in a fixed direction opposite to the applied input voltage such that a zero crossing signal is output by the comparator. The ramping-up and ramping-down of the integrator in the same direction eliminates rollover error in the A/D reading of inputs of different polarities but of the same magnitude. The invention is particularly useful for monolithic A/D converters using BiMOS technology. The preferred embodiment performs a subdivided measurement of a number of integrate/deintegrate phases of the analog input signal, and a second, residual error measurement using a pair of storage capacitors with capacitances in a predetermined multiplier ratio.

22 Claims, 8 Drawing Sheets

FIG. 5 (ANALOG BLOCK)

| PHASE | SWITCH STATE | | | | | | | | | | LEAD IN | |
|---|---|---|---|---|---|---|---|---|---|---|---|---|
| | INT(+) | INT(−) | INT(−) | INT(+) | PE | DE | BST− | INT 2 ZI | X8 X8 | CSW | BUFFER | INT |
| | 111 | 112 | 113 | 114 | 115 | 116 | 117 | 118 | 119 | 120 | | |
| ZI | O | O | O | O | O | O | O | X | X | X | BUFFER | INT |
| INT-1 | X/O | O/X | O/X | X/O | O | O | O | O | X | O | COMP 1 | COMMON |
| DE | O | O | O | O | X | X | O | O | X | O | $V_{IN}(LO/HI)$ | $V_{IN}(HI/LO)$ |
| X8 | O | O | O | O | O | O | O | X | O | X | REF (+) | REF (−) |
| INT-2 | O | O | O | O | O | O | X | O | X | X | COMP 1 | COMMON |
| REST | O | O | O | O | O | O | X | O | X | X | COMMON | COMMON |
| | | | | | | | | | | | COMMON | COMMON |

O=OPEN, X=CLOSED, (HI)/(LO)

OR——BUFFER 1 BUFFER 2 IN FIGURE 5

FIG. 6

(INVENTION)

(INVENTION)

INTEGRATING A/D CONVERTER WITH MEANS FOR REDUCING ROLLOVER ERROR

FIELD OF INVENTION

This invention relates to an integrating type analog-to-digital converter, and particularly, to one having means for eliminating a difference in reading, i.e., rollover error, between positive and negative inputs of the same magnitude.

BACKGROUND OF INVENTION

An analog-to-digital (A/D) converter provides a digital output which indicates the magnitude of an unknown analog input signal. Dual slope or integrating type A/D converters typically include an integrator which integrates an unknown analog input voltage over a fixed period of time which is usually referred to as the integrate cycle, $T_{INT}$. During a subsequent deintegrate cycle, the integrated signal is deintegrated by a known reference voltage until the deintegrated signal as sensed by a comparator reaches a predetermined level (referred to as zero crossing). The variable duration $T_{DE}$ of the deintegrate cycle is proportional to the magnitude of the analog input voltage, since the ratio of the input voltage $V_{IN}$ to the reference voltage $V_{REF}$ is equal to the ratio of the deintegrate cycle to the integrate cycle ($T_{INT}$) according to the well-known equation:

$$T_{DE} = -V_{IN} \times T_{INT}/V_{REF}$$

The duration of the deintegrate cycle can be measured by counting clock pulses, which provides a digital representation of the analog input voltage. The advantage of the dual slope integration technique is that the system becomes insensitive to the values of most of the circuit parameters. The values of the integrating resistor and capacitor of the integrator and the clock period all cancel from the final measurement.

A major drawback of the integrating type A/D converter is its relatively slow speed which is necessitated by the need to obtain a high accuracy time measurement for the zero crossing of the deintegrate cycle. Although the clock speed may be increased, the use of a fast clock is limited by the delay of the comparator in detecting the zero crossing. In order to obtain an accurate count of the deintegration time, the comparator delay should be no more than one-half clock pulse. Using the clock delay pulse criterion, the clock frequency of a typical converter would be limited to 160,000 Hz or approximately 20 readings per second for a 12 bit-conversion.

One solution to the slow speed of the integrating type A/D converter is described in commonly-owned U.S. Pat. No. 4,568,913 to Lee L. Evans entitled HIGH SPEED INTEGRATING ANALOG-TO-DIGITAL CONVERTER issued on Feb. 4, 1986, assigned to Intersil, Inc., which is incorporated herein by reference. This A/D converter measures, in a first deintegrate cycle, a first approximation of the analog input voltage over a very short period, e.g. 128 counts as compared with a typical prior art period of over 8,000 counts. The deintegrate cycle count is stopped at the precise point when a new clock pulse begins after the integrator output crosses zero. The difference between the actual zero crossing point and the measured zero crossing count corresponds to a residual output of the integrator. To obtain a more accurate measurement of the true discharging time, the residual output of the integrator is multiplied by a predetermined scale factor and fed back to the integrator for measurement of the residual error. By subtracting the residual error from the first time measurement, a more accurate measurement of the actual discharge time can be obtained.

The general construction of the A/D converter circuit of the above-mentioned Evans patent is described below with reference to FIG. 1. The converter circuit includes a buffer 30. The buffer 30 receives an unknown analog input signal $V_{IN}$ from a switched input terminal 20. The output of the buffer 30 is connected through a resistor 34, and the appropriate states of switches 64 and 66, to an integrator 36 which includes an amplifier 36a and integrating capacitor 36b and an auto-zero capacitor 32. The output of the integrator 36 is connected to one input (non-inverting) of a comparator 38, the output of which is connected to the input of a zero crossing detector 48 and a control logic unit 52. The integrator output is also connected to a voltage multiplier 40 which includes a resistor 40a, another resistor 40b which has a value equal to a predetermined scale factor, e.g., eight times the value of resistor 40a, and an amplifier 40c. As is well known, amplifier 40c is a standard operational amplifier employed in a multiplier configuration as above described. The output of the voltage multiplier 40 is selectively connected through switches 68 and 70 to a sample-and-hold capacitor 42.

An initial auto-zero cycle is performed, by closing switches 62, 66, 68, and 72, and opening the remainder of the switches, in order to correct for offset voltages of the active devices. For the first integrate cycle, the control logic unit 52 opens the switches 62 and 72 and selects the upper position of the switched input 20 to allow the input signal $V_{IN}$ to be fed to the buffer 30. The signal is integrated by the integrator 36 for a predetermined number of clock pulses. The input signal $V_{IN}$ may have a positive or negative polarity, which is sensed and used to set a polarity bit of the output digital representation. During the deintegrate cycle, the input 20 is switched to a reference voltage $V_{REF}$ of opposite polarity from the input signal and therefore causes the integrator 36 to deintegrate or discharge towards a predetermined level (zero) at a known rate. The technique of determining the polarity of the unknown input signal, selecting the polarity of the reference voltage, and setting the states of the analog switches of the conversion circuit by control signals from the control logic unit 52 are well known.

On the first clock pulse after the output of the comparator 38 crosses zero, the flip-flop 50 generates a pulse to the control logic 52, which then stops the deintegration by opening switch 66 and closing switch 64 in order to isolate the integrator 36 from the input 20. Switch 64 directs the output of the buffer 36 to ground via resistor 34. At this point, switch 70 is closed and the residual output of the integrator 36, multiplied by the selected scale factor, is stored in the capacitor 42. The control logic 52 then opens switch 68 to decouple the output of the voltage multiplier 40 from the capacitor 42. At the same time, switch 74 is closed and the residual value is fed back to the integrator 36 for the residual error measurement. The residual measurement process may be repeated a further time for greater accuracy in the measurement of the actual deintegration time. The count of the deintegration time is maintained by the counter unit 56, converted to digital bits by the register unit 58, and outputted to the display 60. With this type of circuit, 12-bit measurements can be made in cycles of less than 200 clock pulses.

A/D converters of the type described above have been used in monolithic ADC components. However, several factors have prevented monolithic ADC's from achieving 5-digit or greater accuracy. The high gains required for buffering and amplifying are difficult to obtain with CMOS processes typically used for commercial integrating type ADC's. The system noise is also difficult to control and has been known to cause "flickering" of the least significant digits in some ADC converters.

These shortcomings in conventional monolithic ADC's are being addressed by the emergence of bipolar MOS circuits (BiMOS) as a production process alternative for high-performance analog-digital circuits. As compared to MOS transistors, bipolar transistors allow the fabrication of higher gain amplifiers with higher bandwidths and lower offsets. Bipolar transistors also have considerably lower 1/f noise than comparably sized MOS transistors. The bipolar transistors are therefore used in the input stages of the buffers and integrator to improve noise and gain, while the actual input devices are MOS for minimum input bias current. The advantageous use of monolithic BiMOS ADC's is discussed, for example, in an article entitled "A Monolithic ±5½-Digit BiMOS A/D Converter", by Bertram Rodgers and Charles Thurber, IEEE Journal of Solid-State Circuits, Vol. 24, No. 3, Jun. 1989, pp. 617–626, which is incorporated herein by reference. The Rodgers and Thurber article also discusses a multiple integration algorithm wherein an integrate/deintegrate measurement cycle is divided up into subsections of the analog input signal and includes further measurement cycles for residual error.

As distinct from the fabrication of transistors for high-performance analog-digital circuits, the use of bipolar inputs concerns the application of positive and negative voltage inputs (with respect to a common level or ground) to the differential input of an A/D converter. One problem with digital conversion of bi-polar inputs to the integrating type A/D converter in general is that a difference in reading (disregarding the polarity bit) may be obtained between a positive and negative input of the same magnitude. This problem is due to a difference in the performance of the integrator in the integrate and deintegrate phases. As shown with reference to FIG. 2, the operation of the integrator in different voltage ranges for a positive, e.g., +1.5 volt, input (solid line) as compared with a negative input (dashed line) of the same magnitude, can result in a difference in the magnitudes of the integrator outputs in the integrate phase, and also a different ramp-down zero-crossing point in the deintegrate phase, which are referred to together as "rollover error". The rollover error is attributed to operation of the integrator in opposite ramping-up and ramping-down directions, particularly in the lower voltage ranges. The rollover error leads to a difference $E_R$ in the output pulse counts for the respective discharge times. Also, differences occur in the response of the comparator to positive or negative ramp voltages at its input, and hence the zero-crossing measurements, due to hysteresis in the comparator response.

The present invention provides an improvement in dual slope or integrating type A/D converters which greatly reduces or eliminates rollover error. The structure and circuitry described herein provides an improved A/D converter without rollover error which can be used in monolithic BiMOS circuits. Using the techniques to be described, one is also able to reduce the number of components of the A/D converter which would otherwise add to cost or space requirements.

SUMMARY OF INVENTION

In an integrating type A/D converter having an input pair of terminals for receiving an unknown analog input voltage signal having one of positive and negative polarity states, an integrator coupled to said input terminals for providing an integrated signal to be converted to an output digital signal representing the analog input voltage signal. The improvement therewith comprising means for detecting the polarity state of the unknown analog input voltage signal, and, if the polarity state thereof is opposite from a predetermined one of said positive and negative polarity states, for converting the polarity state of the input voltage signal to the predetermined polarity state and means for applying the analog input voltage signal which is in or converted to said predetermined polarity state to the integrator for integration and conversion to an output digital signal, whereby the input voltage signal applied to the integrator is always of the same predetermined polarity state in order to eliminate rollover errors; and in accordance with the invention, a preferred integrating type A/D converter comprises:

an input pair of terminals for receiving an unknown analog input voltage signal having one of positive and negative polarity states;

a pair of reference voltage terminals for receiving reference voltages having predetermined high and low values, respectively;

an input buffer having one input terminal for connection to one of a pair of input leads for an applied voltage, another input terminal connected in feedback connection to its output terminal, and its output terminal connected in series with one end of an integrating resistor;

an integrator, including the integrating resistor and an integrating capacitor, having one input terminal for connection to the other of said pair of input leads for an applied voltage, another input terminal connected in common with the other end of said integrating resistor and one end of an integrating capacitor, said integrating capacitor having its other end connected to an output terminal of said integrator;

a comparator having one input terminal connected to the output terminal of said integrator, a reference input terminal, and an output terminal;

switch means including a control logic unit connected to the output terminal of said comparator, means for detecting the polarity state of the input voltage signal, and a set of analog switches having closed and opened states which are settable by said control logic unit in response to detection of the polarity of the input voltage signal, said switch means being operative for selectively connecting said pair of input terminals with said pair of input leads to said buffer and said integrator in order to apply, during an integrate phase, the input voltage signal across the pair of input leads for a predetermined period of time and in a polarity direction that causes said integrator to ramp up in the same polarity direction regardless of the polarity state of the input voltage signal, wherein an integrated signal is provided at the output terminal of said integrator and stored by said integrating capacitor, and during a deintegrate phase, a reference voltage, is applied across the input leads to said buffer and said integrator in a fixed polarity direction opposite to the applied input voltage in order to deintegrate said stored integrate signal to a predetermined level over a variable period of time corresponding to the amplitude of said integrated signal, wherein a zero crossing signal is provided at the output terminal of said comparator to said control logic unit; and said control logic unit having means, including a clock providing a series of clock pulses, and means for counting the clock pulses during the deintegration phase until said zero crossing signal is provided and for providing a digital representation of the analog input voltage signal corresponding to the counted clock pulses.

The improved A/D converter includes a pair of storage capacitors having capacitances in a predetermined ratio to each other for feeding back to the integrator a residual voltage signal multiplied by the predetermined ratio in a second integrate/deintegrate phase, in order to measure a residual error in the detection of the zero crossing signal and produce a more accurate measurement of the deintegration time. The converter can also perform a subdivided integration technique using a number of integrate/deintegrate phases for measurement of the analog input signal.

BRIEF DESCRIPTION OF DRAWINGS

The above objects and further features and advantages of the invention are described in detail below in conjunction with the drawings, of which:

FIG. 6 is a chart showing the states of the switches of the A/D circuit for the different phases of the measurement cycle in the circuit of FIG. 5;

DETAILED DESCRIPTION OF PREFERRED EMBODIMENTS

Figure 1:
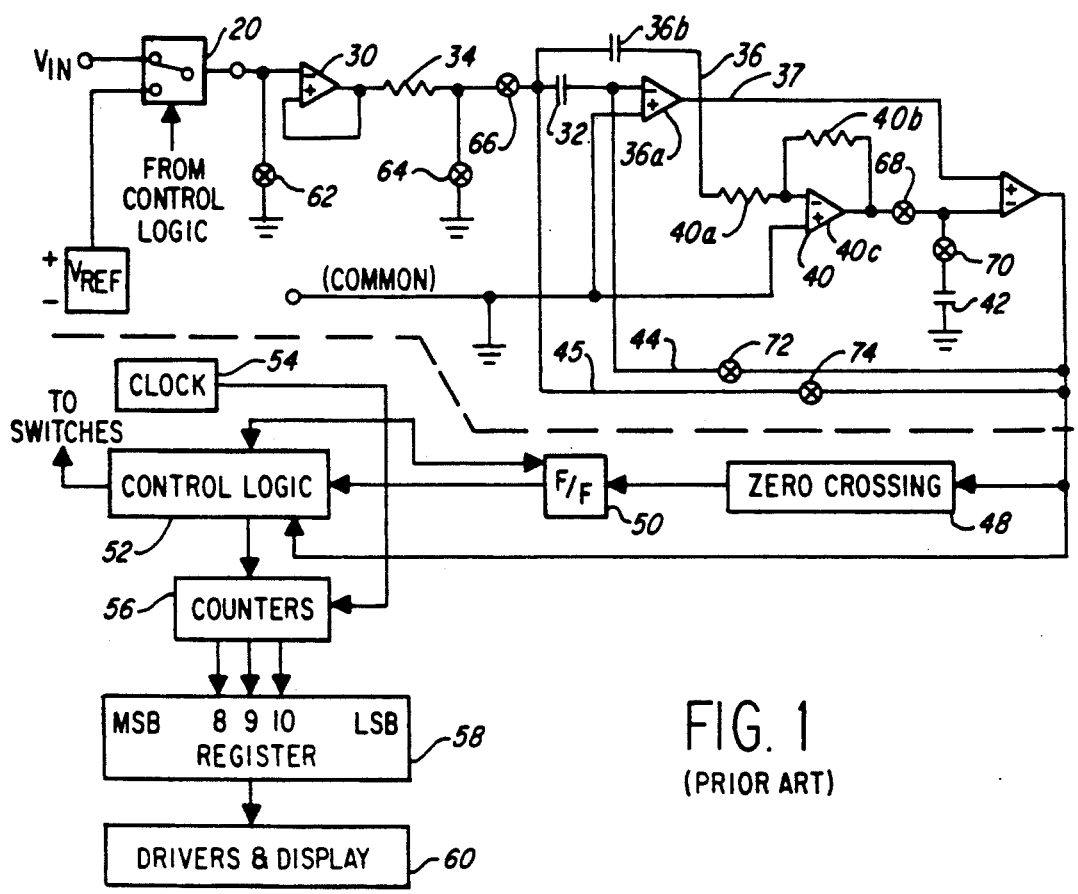
FIG. 1 is a circuit diagram of a conventional, integrating-type analog-to-digital converter.
Figure 2:
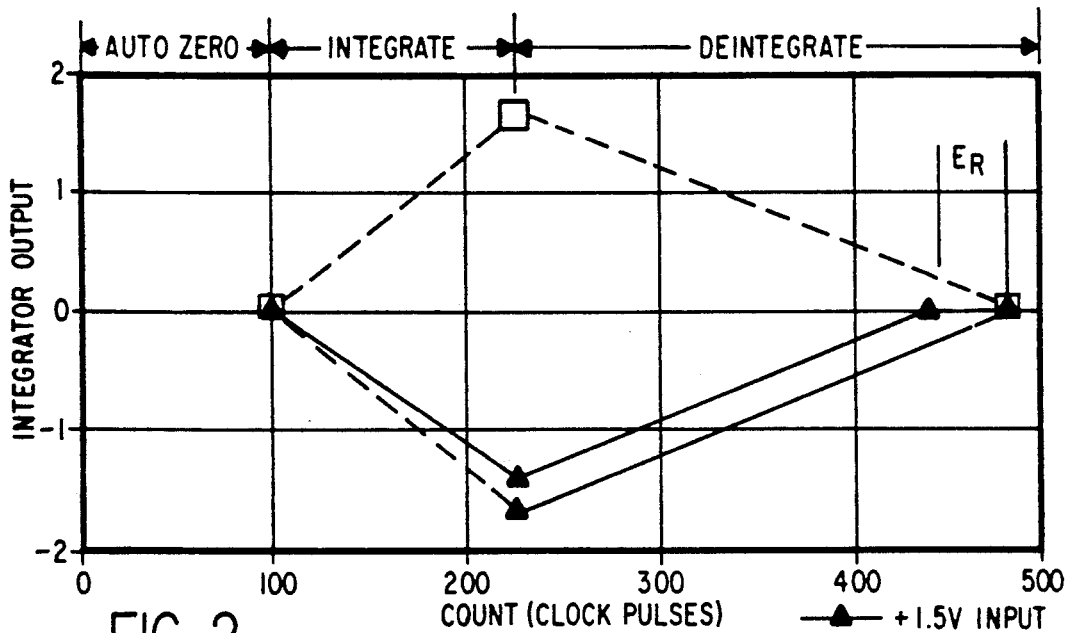
FIG. 2 is a diagram of the integrator output of the conventional A/D converter as shown in FIG. 1, wherein the integrate/deintegrate cycles for input voltages of different polarities ramp in opposite directions and result in a rollover error in the deintegration time measurement.
Figure 3:
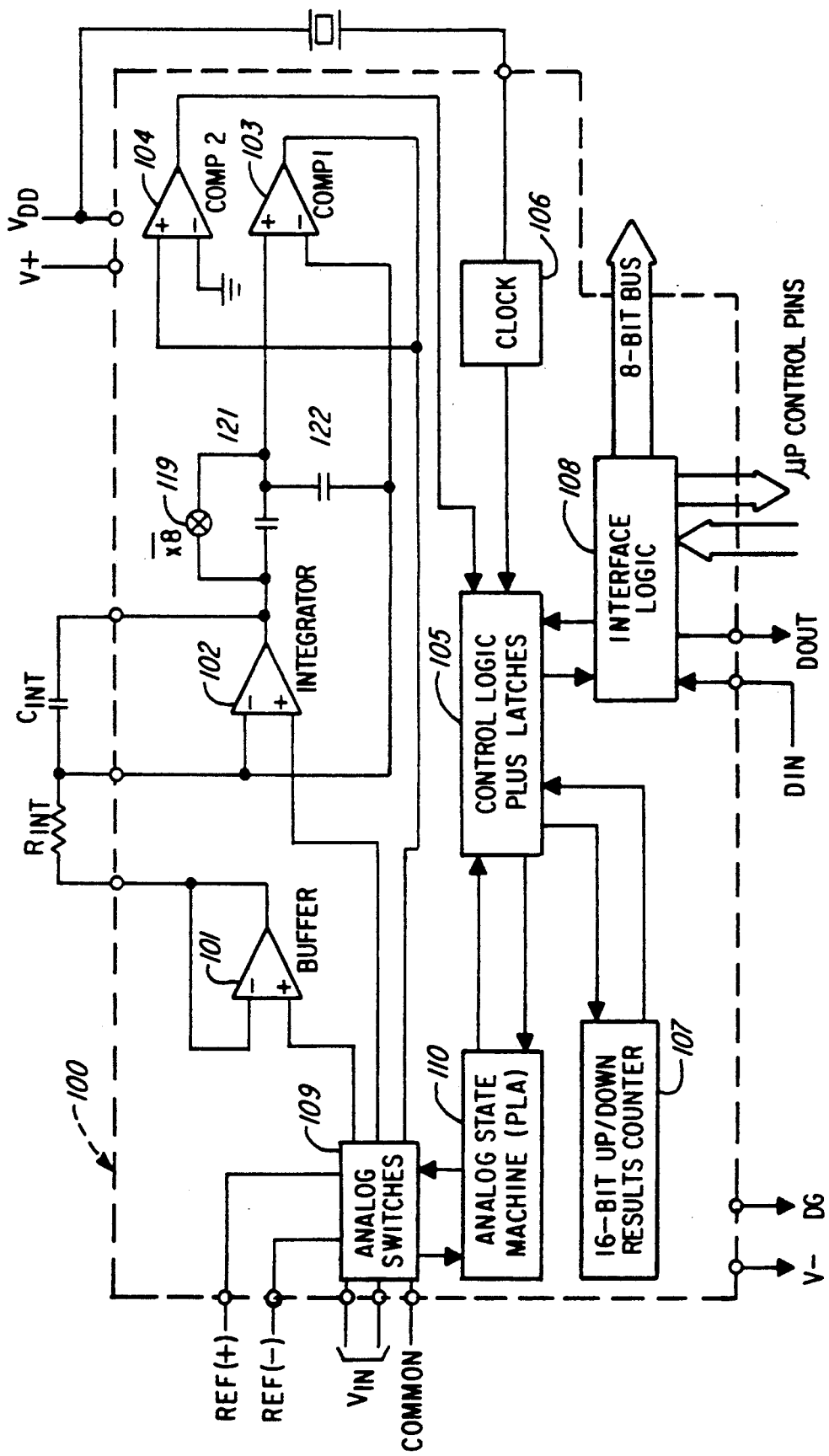
FIG. 3 is a schematic diagram of an improved A/D converter in accordance with the invention implemented in a monolithic A/D circuit.

Referring to FIG. 3, an A/D converter is shown implemented in a monolithic circuit 100. The monolithic A/D circuit includes a buffer 101, an integrator 102, comparators 103 and 104, a control logic unit 105, a clock 106, an up/down counter 107, and an interface logic 108 which outputs digital data corresponding to the analog input signal $V_{IN}$. The general operation of the A/D converter circuit and the functions of its components are well known and have been discussed above with respect to the conventional A/D circuit of FIG. 1. Connector pins to the monolithic A/D converter circuit include supply voltage terminals (V+,V−,$V_{DD}$), high and low reference voltage terminals REF(+) and REF(−), respectively, a pair of input terminals for the analog input voltage $V_{IN}$, a common terminal, an output bus for the measured digital data, and terminals to various external components including the integrating resistor $R_{INT}$ and integrating capacitor $C_{INT}$ and control pins from the interface logic unit 108 to an external microprocessor.

In accordance with the invention, the A/D converter circuit includes a set of analog switches, indicated collectively at 109, and an analog state machine 110 for setting the closed or opened states of the switches 109 in response to control signals from the control logic unit 105. As a principal concept of the invention, the switches 109 and analog state machine 110, as controlled by the control logic unit 105, are set to selectively connect the input terminals for $V_{IN}$ with the input leads to the buffer 101 and the integrator 102 so as to apply analog input signal $V_{IN}$ in a polarity direction that will cause the integrator 102 to ramp up in the same direction, regardless of the polarity of the analog input signal, during the integrate phase of a measurement cycle. In the deintegrate phase, the high and low reference voltages REF(+) and REF(−) are applied across the buffer and the integrator always in the same direction opposite to the ramp-up direction of the integrator in order to deintegrate the stored integrated voltage signal to a predetermined level (zero crossing).

Figure 4:
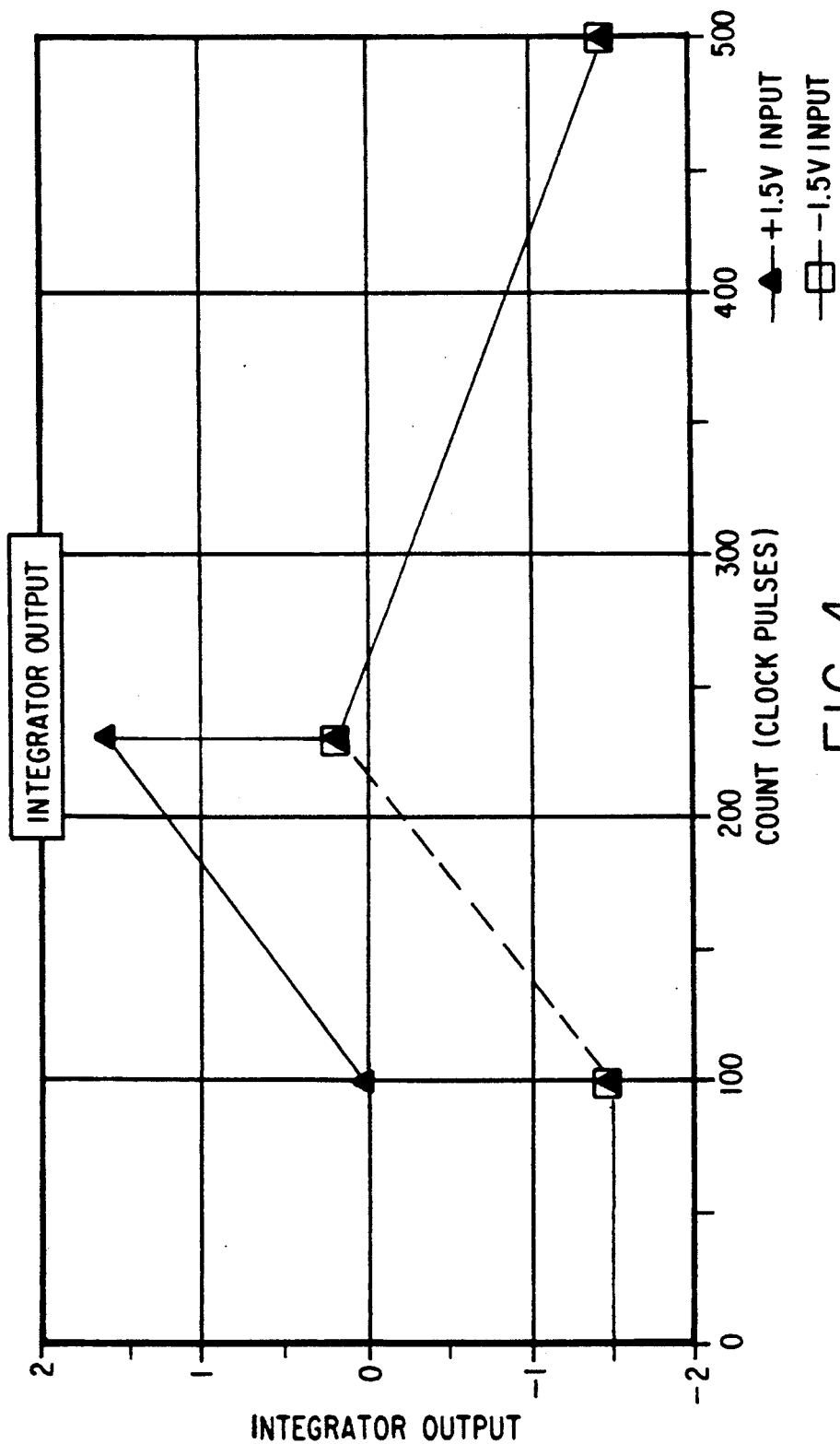
FIG. 4 is a diagram showing the deintegrate/integrate cycles for input voltages of different polarities by operation of the integrator in the same ramping-up direction in accordance with the invention, and a resulting reduction or elimination of rollover error in the deintegration time measurement.

As illustrated in FIG. 4, operation of the integrator 102 is to ramp up in the same direction for input signals $V_{IN}$ of both positive and negative polarities. In this example, the difference in the integrate phase for a positive input signal versus a negative input signal is due to the voltage shift induced via Cint at the integrator output when the connection to the integrator non-inverting input is switched between Vin Lo and Vin Hi or vice-versa. If Vin Lo is connected to Common=OV, then for Vin=−1.5 V, Vin Lo=OV is switched to the Integrator input and Vin Hi=−1.5 V is switched to the Buffer input. For Vin=+1.5 V, Vin Hi=+1.5 V is switched to the Integrator input and Vin Lo=OV is switched to the Buffer input. Since the Integrator input is 1.5 V higher for the case of positive Vin, the Integrator output also starts at a voltage 1.5 V higher than for a negative Vin. Just prior to the start of the integrate phase, Cint is charged to −1.5 V, which drives the Integrator output to −1.5 V if both the Buffer and Integrator inputs are connected to Common or OV. For negative Vin when the Integrator input is connected to In Lo=OV, there is no change in the Integrator output at the start of the integrate phase. In FIG. 4, this corresponds to the lower trace, which starts at −1.5 V and then ramps up towards OV. For positive Vin, the Integrator input is connected to In Hi=1.5 V, which causes the Integrator output to jump from −1.5 V to OV. In FIG. 4, this corresponds to the upper trace, which starts at −1.5 V, jumps to OV, and then ramps up towards +1.5 V. The reason for the initial offset between Integrator input and output is to take advantage of the fact that the Integrator output always ramps in a positive direction and to bias its starting point at a low voltage to give maximum possible output swing capability for improved dynamic range.

During the de-integrate phase, Ref Lo is always switched to the Integrator input and Ref Hi is always switched to the Buffer input. Therefore the de-integrate phases look identical for both polarities of input signal, thereby greatly reducing or eliminating the rollover error. However, the Integrator output must never drift negatively during the integrate phase, because the applied reference polarity would not be able to de-integrate this voltage back towards the starting point. In the auto-zero conversion cycle, the two inputs are both shorted to Common to give a reading of the internal system offset voltage. This offset reading can then be digitally subtracted from the analog input conversion reading to give an offset corrected result. The internal system offset could have a polarity which would cause the Integrator output to drift in a negative direction during the integrate phase. Therefore, a deliberate offset of about 15 mV is introduced that is large enough to overcome the largest expected naturally occurring system offset, with a polarity that ensures positive integration.

Figure 5:
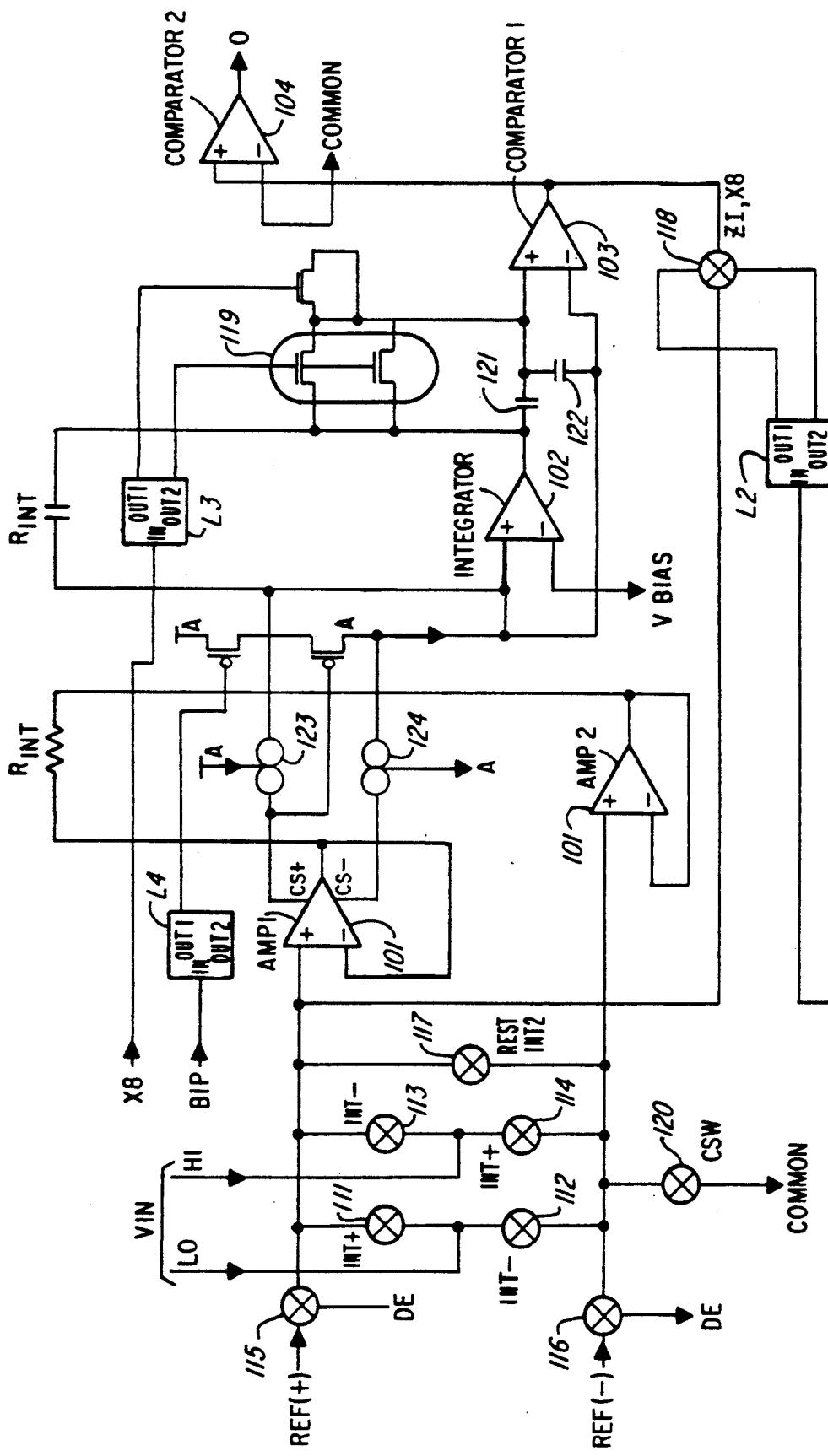
FIG. 5 is a detailed circuit diagram of a preferred embodiment of the A/D converter circuit illustrated in FIG. 3.
Figure 7A:
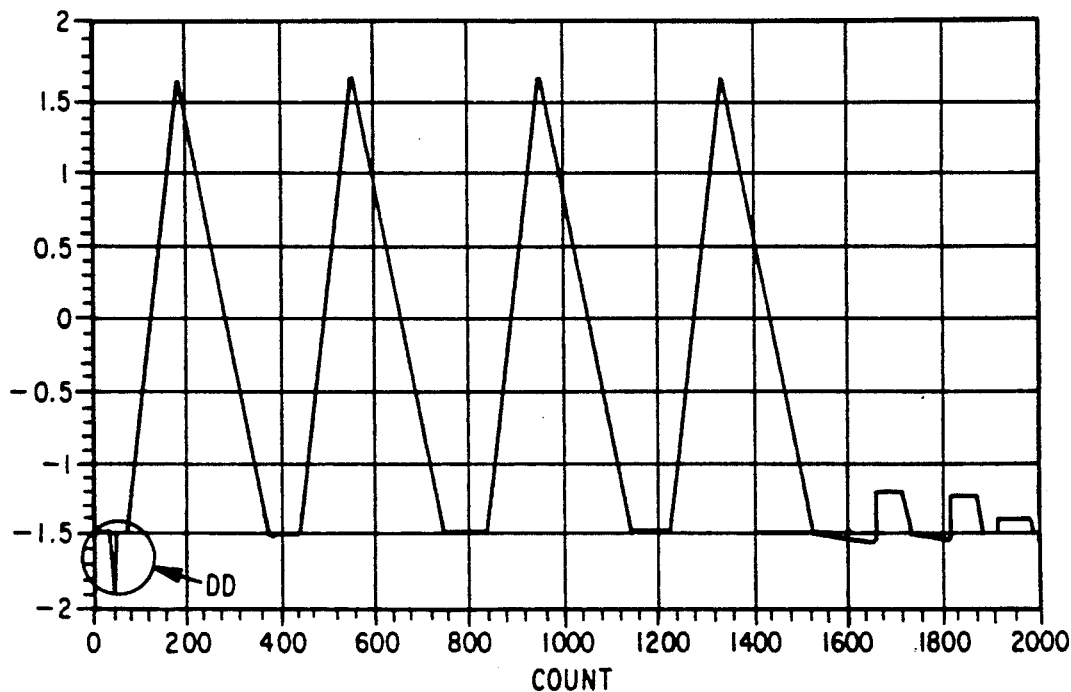
FIGS. 7A and 7B are charts showing the integrator outputs for analog input signals of a positive polarity during a measurement for the invention as compared to the prior art.
Figure 7B:
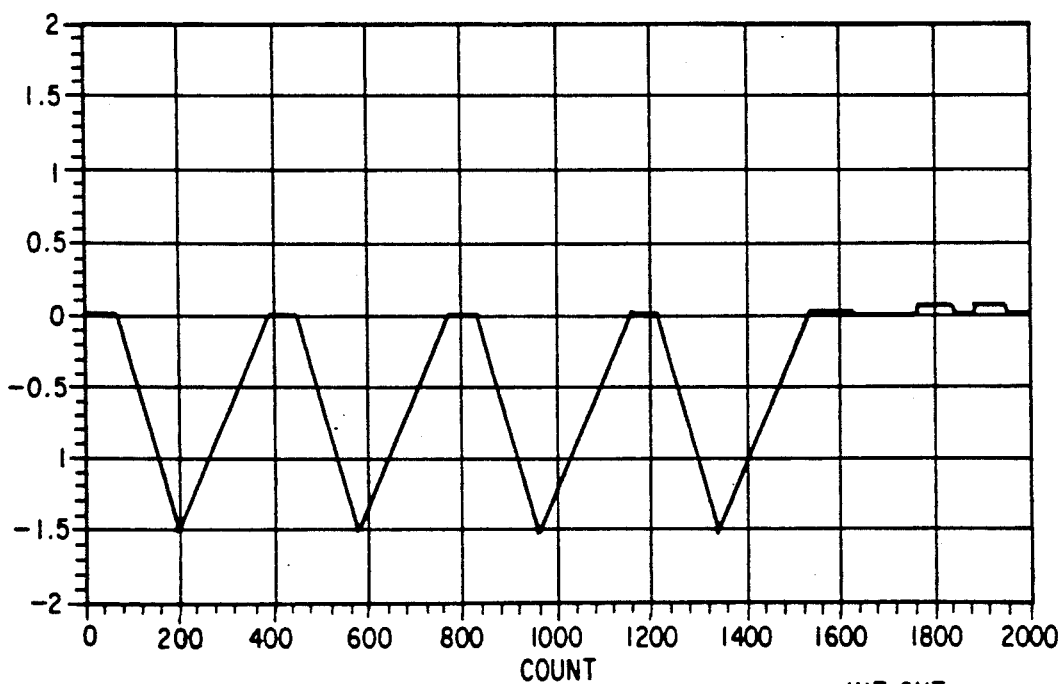
Figure 8A:
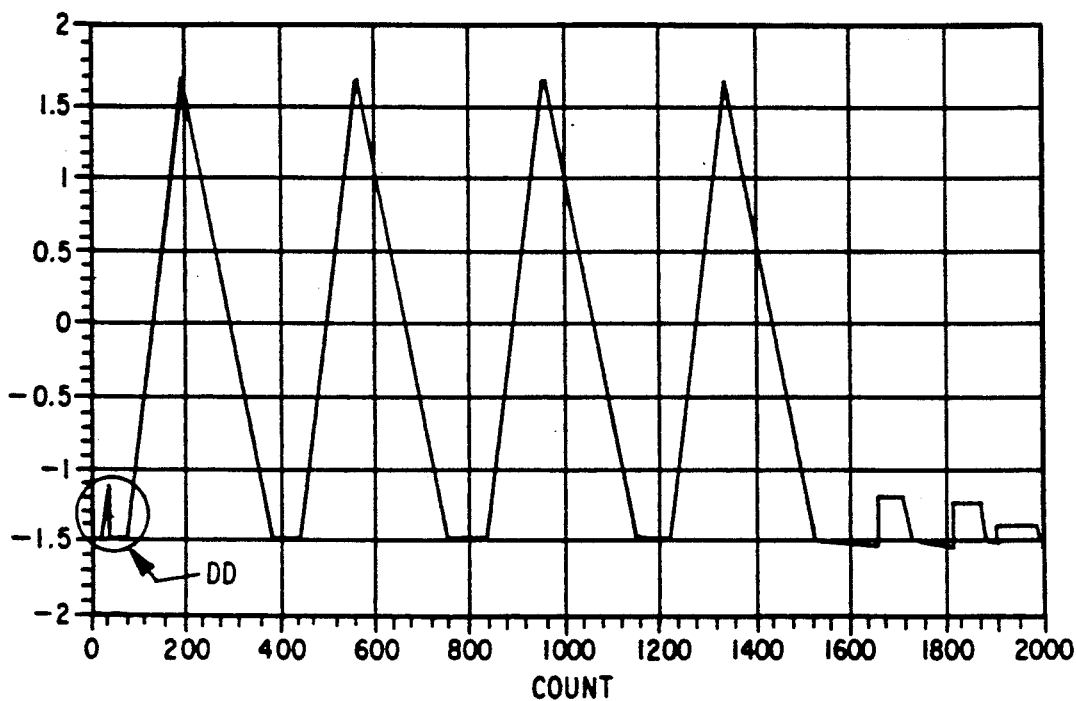
FIGS. 8A and 8B are charts showing the integrator outputs for analog input signals of a negative polarity during a measurement for the invention as compared to the prior art.
Figure 8B:
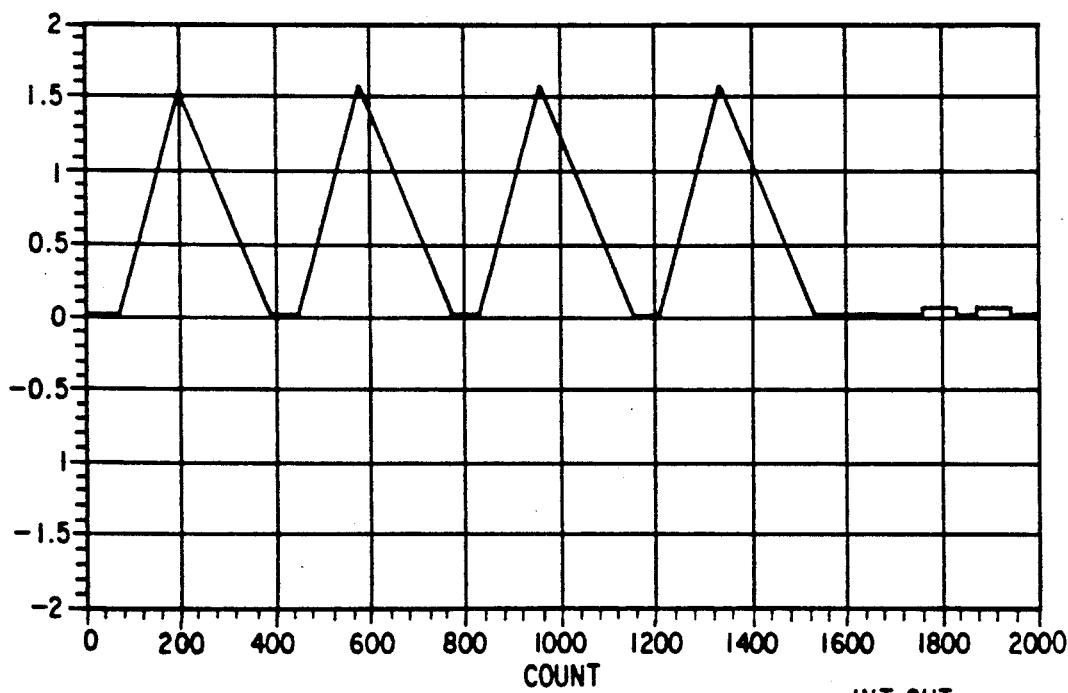

In FIG. 5, a preferred embodiment of the A/D converter circuit is shown having switches 109 implemented at the indicated positions 111-120. The switches assume closed or opened states as set by the analog state machine 110 in response to the logic control unit 105 for the various phases of a measurement cycle. The four switches at 111-114 are set to apply an analog input of either polarity in the same polarity direction across the two buffers 101. The two buffers in conjunction with the two current mirrors, 123 and 124, form what could be called a current-mode instrumentation amplifier. The two buffers apply the input voltage across the integrating resistor Rint and the two current mirrors replicate the current through resistor Rint into the summing node at the inverting input of Integrator 102. This arrangement allows the Integrator input to be biased at fixed voltage, Vbias, such that the jump in the Integrator output voltage that occurs for different Vin polarities, described above, is eliminated. Furthermore, the gain, common-mode rejection, and noise requirements of the Integrator are significantly reduced.

Similar to the converter circuit of the Evans U.S. Pat. No. 4,568,913, the converter circuit in this invention includes means for storing a residual voltage of the integrator output. This occurs between the actual zero crossing level and the level measured at the time the integrate cycle is ended. Storage occurs upon the next clock pulse after the zero crossing. In the preferred embodiment, this is obtained by storage capacitors 121 and 122. Capacitor 122 is 8 times the value of capacitor 121. Since the X8-bar switch at 119 is closed during the integrate cycle, the residual voltage of the integrator output is stored on the 8C capacitor 122. During the X8 phase, switch at 119 is opened and the feedback switch at 118 is closed. The voltage across the inputs of comparator 103 and thus across capacitor 122 is forced to zero by the feedback around the system loop when switch 118 is closed. Since the X8-bar switch at 119 is now open, the charge that existed on 8C capacitor 122 now flows into 1C capacitor 121. This induces a voltage at the output of the Integrator that is −8 times the residual voltage at the end of the de-integrate phase. This voltage can now be de-integrated with a count resolution 8 times or 3 bits greater than the initial de-integration. For example, if the initial de-integrate phase can accommodate 1024 counts, this corresponds to 10 bits of resolution. Two subsequent X8 phases will add 3+3=6 bits of resolution to the conversion, resulting in a 16 bit conversion overall. Each X8 phase might only take 96 clock cycles, so that total conversion time is much less than if the full 65,536 clock cycles required for a conventional 16-bit de-integrate were performed. Thus a much faster A/D converter may be constructed.

The measurement cycle of the A/D converter includes: a zero-integrate phase ZI, for resetting the integrator and for setting up the comparator at the edge of its trip point; a first integrate phase INT-1, for integrating the analog input signal; a de-integrate phase DE, for deintegrating the stored integrated voltage to derive a time measurement therefrom; a X8 phase for multiplying the residual voltage at the output of the integrator by a factor of eight; a second integrate phase INT-2, for integrating the system offset with the two inputs shorted during an offset conversion cycle; and a rest phase which occurs at several points during the conversion cycle, at the end of various phases, either to allow internal signals to settle, or as a wait state at the end of a de-integrate phase after a zero-crossing is detected. The states of the set of switches 109 for these phases of the measurement cycle are illustrated in the chart in FIG. 6.

In a modified mode of operation, the A/D converter can perform a series of measurement phases for successive subdivisions of an analog input signal. As described in commonly-owned U.S. Pat. No. 4,656,459 to Charles Thurber, Jr., and in the previously mentioned Rodgers and Thurber article, a limitation on the rate at which some dual slope A/D converters can convert an analog voltage is the finite response time of the comparator which detects the zero crossing of the deintegrated signal. The comparator response time is also related to the maximum voltage that the integrator can charge up to divided by the system resolution. However, the maximum integrator voltage is typically limited by the power supply voltage of the system. Increasing the power supply voltage can increase power consumption as well as complicate the design of the system. Accordingly, in these references, an increased apparent integrator voltage swing is obtained by dividing the measurement cycle into a plurality of interleaved integrate/deintegrate phases, each of which is less than a full power line cycle. As a result, power line noise rejection or normal mode rejection is maintained while increasing the apparent integrator voltage swing in accordance with the number of integrate/deintegrate phases. A rest phase is interposed between the termination of each deintegrate phase and the beginning of the next integrate phase, during which time the integrator output remains constant. This is implemented in order to preserve the residual signal from the previous phase as the starting point of the next phase.

Figure 9:
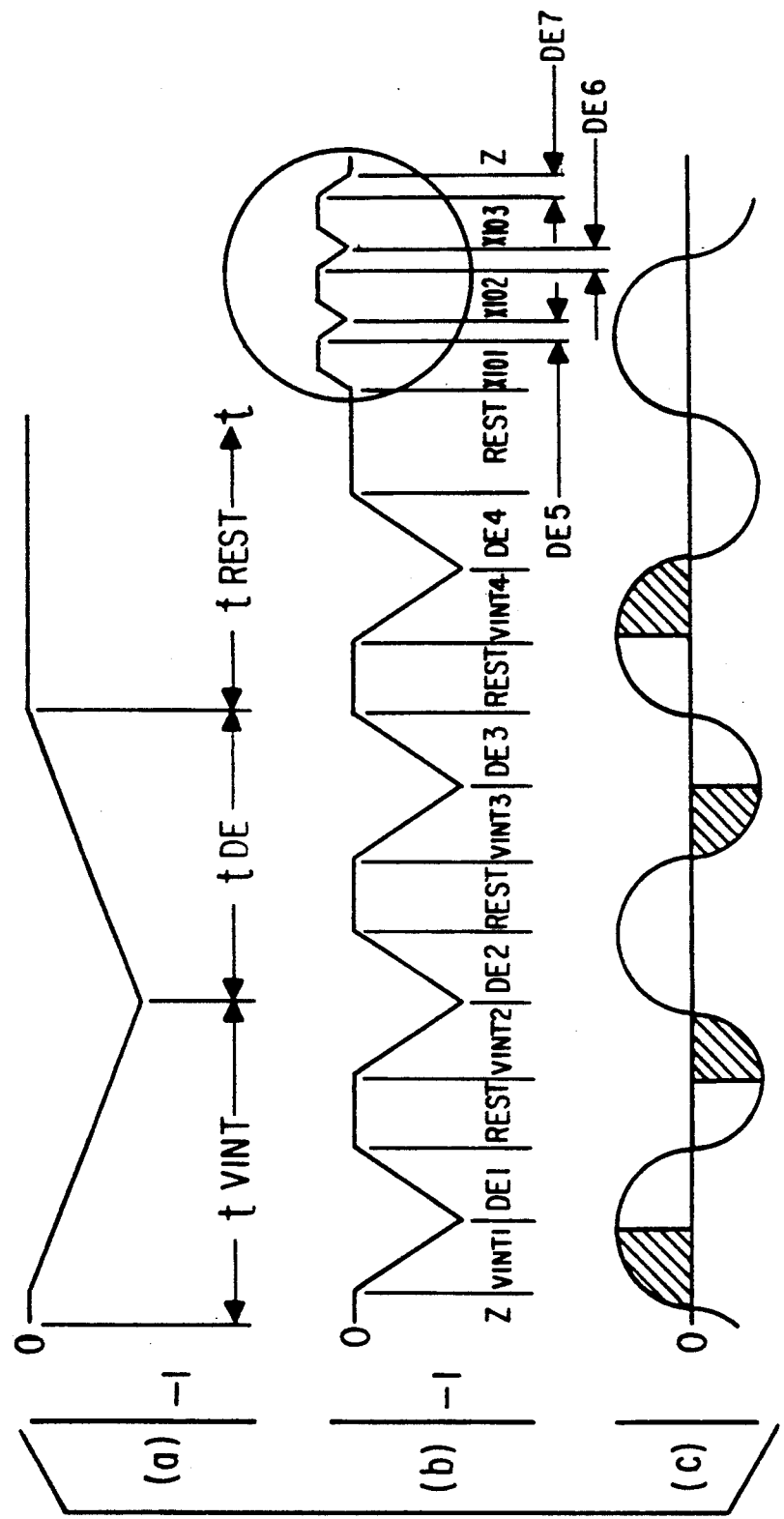
FIG. 9 is a timing diagram showing the measurement cycle divided up into subsections of the analog input signal as compared to an undivided measurement cycle.

In FIG. 9, the waveform diagram (a) shows the conventional single integrate/deintegrate phase over one measurement cycle, whereas diagram (b) shows the measurement cycle divided into four integrate/deintegrate phases with the sum of signal integration time for the four phases equal to the time $t_{VINT}$ for the single phase measurement cycle. The timing of each subdivided measurement phase for the technique shown in diagram (b) is shown with reference to the shaded area of the power supply waveform in diagram (c).

FIGS. 7A and 7B, and 8A and 8B, show the integrator output for positive and negative input voltages, respectively, of the same magnitude using this divided phase measurement technique. The brief response DD shown at the beginning of the output waveforms is the detection cycle for the polarity of the input signal. The responses shown following the output waveforms are measurement(s) for the residual error. The integrate phase is biased at $-1.5$ volts in FIGS. 7A and 8A.

In this example, the total of integrate phases takes 512 clock cycles, and the deintegrate phases can take anywhere from 0 to 1024 clock cycles corresponding to a 10-bit conversion. Two X8 phases increases this resolution to 13 bits and then to 16 bits. The invention is particularly advantageous as applied to monolithic ADC circuits, particularly BiMOS ADC's. The timing and control of all switches in the analog front end can be controlled by a PLA state machine. The output data (16-bits, polarity bit, and over-range bit) may be accessed via different types of interfaces, for example, as shown in FIG. 3, via an 8-bit byte-oriented bus, or serial UART interfaces with pinselectable baud rates. Another serial version could accommodate synchronous transfer formats of most commercial microcontrollers.

The A/D converter circuit in accordance with the invention improves on the well-established dual slope conversion techniques by greatly reducing or eliminating rollover error and removing the need for the commonly used reference capacitor. The high and low reference voltages are always applied across the buffer and integrator in the same polarity direction. This saves the user both the cost and space of a fairly large and expensive 0.1 uF or 1 uF low dielectric absorption capacitor (polypropylene or similar material), and also eliminates the need for several pins. In addition, errors associated with charge sharing between the reference capacitor and stray capacitance at its terminals, as it is switched into the circuit during the deintegrate phase, are eliminated.

The specific embodiments of the invention described herein are intended to be illustrative only, and many other variations and modifications may be made thereto in accordance with the principles of the invention. All such embodiments and variations and modifications thereof are considered to be within the scope of the invention, as defined in the following claims.

I claim:

1. In an integrating type A/D converter having an input pair of terminals for receiving an unknown analog input voltage signal having one of positive and negative polarity states, an integrator coupled to said input terminals for providing an integrated signal to be converted to an output digital signal representing the analog input voltage signal, the improvement therewith comprising:

means for detecting the polarity state of the unknown analog input voltage signal, and if the polarity state thereof is opposite from a predetermined one of said positive and negative polarity states, for converting the polarity state of the input voltage signal to the predetermined polarity state;

means for applying the analog input voltage signal which is in or converted to said predetermined polarity state to the integrator for integration and conversion to an output digital signal, whereby the input voltage signal applied to the integrator is always of the same predetermined polarity state in order to eliminate rollover errors;

wherein said means for detecting and converting the polarity state of the unknown analog input voltage signal comprises switch means including a control logic unit and a set of analog switches having closed and open states which are settable by said control logic unit in response to detection of the polarity of the unknown analog input voltage signal, said switch means being operative for selectively connecting said pair of input terminals with said integrator in order to apply the input voltage signal to the integrator in said predetermined polarity direction; and a pair of sources of reference voltages of predetermined high and low values corresponding to positive and negative polarity states of the input voltage signal, respectively, and said switch means being controlled by said logic control unit such that, during an integrate phase, the input voltage signal is applied to the integrator for a predetermined period of time in a polarity direction corresponding to said predetermined polarity state, wherein an integrated signal of the same polarity direction is provided at the output of said integrator, and then in a deintegrate phase, a reference voltage is applied to said integrator in an opposite polarity direction in order to deintegrate said integrated voltage signal to a predetermined level over a variable period of time corresponding to an amplitude of said integrated voltage signal.

2. An integrating type A/D converter according to claim 1, further comprising a comparator for comparing the output of said integrator with a reference level and providing a zero crossing signal when said output has reached said reference level, and wherein said control logic unit includes a clock for providing a series of clock pulses, means for counting the clock pulses during the deintegration phase until said zero crossing signal is provided, and means for providing a digital representation of the analog input voltage signal corresponding to the counted clock pulses.

3. An integrating type A/D converter according to claim 1, wherein said switch means includes an analog state machine for setting the states of said set of switches in response to control signals provided from said control logic unit.

4. In an integrating type A/D converter having an input pair of terminals for receiving an unknown analog input voltage signal having one of positive and negative polarity states, an integrator coupled to said input terminals for integrating the input voltage signal and then deintegrating the integrated signal against a reference voltage, and a comparator for comparing an output of said integrator to a predetermined reference level and providing an output of a zero crossing signal when the integrator output has reached said predetermined reference level, the improvement therewith comprising:

switch means including a control logic unit connected to the output of said comparator, means for detecting the polarity state of the input voltage signal, and a set of analog switches having closed and open states which are settable by said control logic unit in response to detection of the polarity state of the input voltage signal, said switch means being operative for selectively coupling said input terminals to said integrator in order to apply, during an integrate phase, the input voltage signal for a predetermined period of time and in a polarity direction that causes said integrator to ramp up in the same polarity direction regardless of the polarity state of the input voltage signal, wherein an integrated signal is provided at the output of said integrator, and to apply, during a deintegrate phase, the reference voltage to said integrator in a polarity direction opposite to the ramp-up direction of said integrator in order to deintegrate said integrated signal to a predetermined level over a variable period of time corresponding to the amplitude of said integrated signal, whereupon said comparator provides a zero crossing signal to said control logic unit; and a pair of storage capacitors, one of which is connected by a switchable shunt path to the output of said integrator, and the other of which is connected in parallel with said shunt path between said integrator and said comparator, said storage capacitors having capacitances in a predetermined ratio to each other for feeding back to the integrator a residual voltage signal multiplied by the predetermined ratio in a second integrate/deintegrate phase, in order to measure a residual error in the detection of the zero crossing signal and produce a more accurate measurement of the deintegration time.

5. An integrating type A/D converter according to claim 4, wherein said control logic unit includes a clock providing a series of clock pulses, and means for counting the clock pulse during the deintegration phase until said zero crossing signal and for providing a digital representation of the input voltage signal corresponding to the counted clock pulses.

6. An integrating type A/D converter according to claim 4, wherein said integrator, comparator, switch means, and control logic unit are formed as an integrated circuit.

7. An integrating type A/D converter according to claim 6, further comprising an analog state machine formed in said integrated circuit for setting the states of said set of switches in response to control signals provided from said control logic unit.

8. An integrating type A/D converter according to claim 4, wherein said set of switches and said control logic unit include means for setting the states of the switches to perform an auto-zero correction operation.

9. An integrating type A/D converter according to claim 4, wherein said set of switches and said control logic unit include means for setting the states of the switches to perform a first integrate/deintegrate phase for measurement of the deintegration time, followed by a residual value storing phase for storing a residual voltage of the integrator output multiplied by a predetermined factor, and then a second integrate/deintegrate phase for measurement of a residual error to be subtracted from the first measurement of the deintegration time.

10. An integrating type A/D converter according to claim 9, wherein said predetermined multiplier factor is 8 and provides an additional 3-bit resolution of measurement.

11. An integrating type A/D converter according to claim 10, wherein said set of switches and said control logic unit include means for setting the states of the switches to perform a measurement cycle within a number of clock pulses corresponding to a 10-bit measurement, said second integrate/deintegrate phase, and a third integrate/deintegrate phase for a further 3-bit resolution of residual error measurement, thereby providing a total of 16-bit resolution of measurement.

12. An integrating type A/D converter according to claim 11, further comprising a 16-bit up/down counter.

13. An integrating type A/D converter comprising:

an input pair of terminals for receiving an unknown analog input voltage signal having one of positive and negative polarity states;

a pair of reference voltage terminals for receiving reference voltages having predetermined high and low values, respectively;

an input buffer having one input terminal for connection to one of a pair of input leads for an applied voltage, another input terminal connected in feedback connection to its output terminal, and its output terminal connected in series with one end of an integrating resistor;

an integrator, including the integrating resistor and an integrating capacitor, having one input terminal for connection to the other of said pair of input leads for an applied voltage, another input terminal connected in common with the other end of said integrating resistor and one end of said integrating capacitor, said integrating capacitor having its other end connected to an output terminal of said integrator;

a comparator having one input terminal connected to the output terminal of said integrator, a reference input terminal, and an output terminal;

switch means including a control logic unit connected to the output terminal of said comparator, means for detecting the polarity state of the input voltage signal, and a set of analog switches having closed and opened states which are settable by said control logic unit in response to detection of the polarity of the input voltage signal, said switch means being operative for selectively connecting said pair of input terminals with said pair of input leads to said buffer and said integrator in order to apply, during an integrate phase, the input voltage signal across the pair of input leads for a predetermined period of time and in a polarity direction that causes said integrator to ramp up in the same polarity direction regardless of the polarity state of the input voltage signal, wherein an integrated signal is provided at the output terminal of said integrator and stored by said integrating capacitor, and during a deintegrate phase, a reference is applied across the input leads to said buffer and said integrator in a polarity direction opposite to the applied input voltage of said integrator in order to deintegrate said stored integrated signal to a predetermined level over a variable period of time corresponding to the amplitude of said integrated signal, wherein a zero crossing signal is provided at the output terminal of said comparator to said control logic unit; and said control logic unit having means, including a clock providing a series of clock pulses, and means for counting the clock pulses during the deintegration phase until said zero crossing signal is provided and for providing a digital representation of the analog input voltage signal corresponding to the counted clock pulses.

14. An integrating type A/D converter according to claim 13, further comprising a pair of storage capacitors, one of which is connected by a switchable shunt path to the output terminal of said integrator, and the other of which is connected in parallel with said shunt path between said integrator and said comparator, said storage capacitors having capacitances in a predetermined ratio to each other for feeding back to the integrator a residual voltage signal multiplied by the predetermined ratio in a second integrate/deintegrate phase, in order to measure a residual error in the detection of the zero crossing signal and produce a more accurate measurement of the deintegration time.

15. An integrating type A/D converter according to claim 13, wherein said input pair of terminals, pair of reference terminals, input buffer, integrator, comparator, switch means, and control logic unit are formed as an integrated circuit.

16. An integrating type A/D converter according to claim 15, further comprising an analog state machine formed with said integrated circuit for setting the states of said set of switches in response to control signals provided from said control logic unit.

17. An integrating type A/D converter according to claim 13, wherein said set of switches and said control logic unit include means for setting the states of the switches to perform an auto-zero correction operation.

18. An integrating type A/D converter according to claim 13, wherein said set of switches and said control logic unit include means for setting the states of the switches to perform a first integrate/deintegrate phase for measurement of the deintegration time, followed by a residual value storing phase for storing a residual voltage of the integrator output multiplied by a predetermined factor, and then a second integrate/deintegrate phase for measurement of a residual error to be subtracted from the first measurement of the deintegration time.

19. An integrating type A/D converter according to claim 18, wherein said predetermined multiplier factor is 8 and provides an additional 3-bit resolution of measurement.

20. An integrating type A/D converter according to claim 19, wherein said set of switches and said control logic unit include means for setting the states of the switches to perform a measurement cycle within a number of clock pulses corresponding to a 10-bit measurement, said second integrate/deintegrate phase, and a third integrate/deintegrate phase for a further 3-bit resolution of residual error measurement, thereby providing a total of 16-bit resolution of measurement.

21. An integrating type A/D converter according to claim 20, further comprising a 16-bit up/down counter.

22. An integrating type A/D converter according to claim 13, wherein said set of switches and said control logic unit include means for setting the states of the switches to perform a subdivided integration operation using a number of integrate/deintegrate phases for measurement of the analog input signal.

* * * * *